United States Patent
Togashi et al.

(10) Patent No.: US 10,768,529 B2
(45) Date of Patent: Sep. 8, 2020

(54) PROXIMITY EXPOSURE METHOD

(71) Applicant: V TECHNOLOGY CO., LTD., Yokohama-shi, Kanagawa (JP)

(72) Inventors: Takumi Togashi, Yokohama (JP); Tomonori Harada, Yokohama (JP)

(73) Assignee: V TECHNOLOGY CO., LTD., Yokohama-shi, Kanagawa (JP)

(*) Notice: Subject to any disclaimer, the term of this patent is extended or adjusted under 35 U.S.C. 154(b) by 0 days.

(21) Appl. No.: 16/338,088

(22) PCT Filed: Aug. 23, 2017

(86) PCT No.: PCT/JP2017/030198
§ 371 (c)(1),
(2) Date: Mar. 29, 2019

(87) PCT Pub. No.: WO2018/061544
PCT Pub. Date: Apr. 5, 2018

(65) Prior Publication Data
US 2020/0026192 A1 Jan. 23, 2020

(30) Foreign Application Priority Data
Sep. 30, 2016 (JP) .................. 2016-194981

(51) Int. Cl.
*G03F 7/20* (2006.01)
*G03F 9/00* (2006.01)
*G03F 1/42* (2012.01)

(52) U.S. Cl.
CPC .............. *G03F 7/2008* (2013.01); *G03F 1/42* (2013.01); *G03F 7/7035* (2013.01);
(Continued)

(58) Field of Classification Search
CPC ........ G03F 7/7035; G03F 9/7038; G03F 1/42; G03F 9/703
See application file for complete search history.

(56) References Cited

U.S. PATENT DOCUMENTS

| 2002/0058348 | A1 | 5/2002 | Lee |
| 2010/0040975 | A1 | 2/2010 | Wada |

(Continued)

FOREIGN PATENT DOCUMENTS

| JP | 2002-100557 A | 4/2002 |
| JP | 2002-134394 A | 5/2002 |

(Continued)

OTHER PUBLICATIONS

International Search Report dated Nov. 21, 2017 issued by the International Searching Authority in counterpart International Application No. PCT/JP2017/030198 (PCT/ISA/210).
(Continued)

*Primary Examiner* — Michelle M Iacoletti
(74) *Attorney, Agent, or Firm* — Sughrue Mion, PLLC

(57) ABSTRACT

A proximity exposure method, wherein a mask (M) of which the master patterns (31) are formed larger than the resolution limit of the resist (R) is prepared with respect to the resist patterns (43) having the minimum pitch (P) equal to or smaller than the resolution limit of the resist (R); in the first exposure step, the mask (M) and the workpiece (W) are relatively step-moved by the pitch (P) of the resist patterns (43) after the mask patterns (31) are exposed and transferred onto the workpiece (W); and in the second exposure step, the mask patterns (31) are exposed and transferred onto the workpiece (W) again.

3 Claims, 7 Drawing Sheets

(52) U.S. Cl.
CPC ........ *G03F 7/70466* (2013.01); *G03F 9/7003* (2013.01); *G03F 9/7038* (2013.01)

(56) References Cited

U.S. PATENT DOCUMENTS

| | | |
|---|---|---|
| 2014/0245241 A1 | 8/2014 | Arai |
| 2015/0050765 A1* | 2/2015 | Bohm .................. H01L 33/005 438/33 |

FOREIGN PATENT DOCUMENTS

| | | |
|---|---|---|
| JP | 2002-164282 A | 6/2002 |
| JP | 2003-332194 A | 11/2003 |
| JP | 2008-191341 A | 8/2008 |
| JP | 2008-209889 A | 9/2008 |
| JP | 2011-34704 A | 2/2011 |
| JP | 2014-164054 A | 9/2014 |

OTHER PUBLICATIONS

International Search Report dated Nov. 21, 2017 issued by the International Searching Authority in counterpart International Application No. PCT/JP2017/030198 (PCT/ISA/237).

Japanese Office Action dated Mar. 3, 2020, issued by the Japanese Intellectual Property Office in counterpart Japanese Application No. 2016-194981.

* cited by examiner

STAGE MOVEMENT BY ONE PITCH ⇒ EXPOSURE    ▨ EXPOSED

PROXIMITY EXPOSURE METHOD

TECHNICAL FIELD

The present disclosure relates to a proximity exposure method, and more particularly, relates to a proximity exposure method in which mask patterns are exposed and transferred onto a workpiece at a pitch equal to or smaller than a resolution limit of a resist.

BACKGROUND ART

In proximity exposure, a mask and a workpiece are arranged opposing each other with a predetermined gap therebetween, the mask is irradiated with light for pattern exposure, and the mask patterns of the mask are exposed and transferred onto a photoresist of the workpiece by a photolithography method. In recent years, miniaturization and high integration of patterns has been advanced, and patterning at a resist pattern pitch equal to or smaller than a resolution limit (resolution) of the resist is required.

Patent Document 1 discloses a technique capable of exposing at a pitch equal to or smaller than a resolution limit of a resist, in which a first mask having openings arranged at a pitch of 2× and a second mask having a pitch of 2× and displaced by one pitch with respect to the openings of the first mask with respect to a pitch x of resist patterns are prepared, and the first mask and the second mask are sequentially arranged one by one on the resist to perform exposure.

PRIOR ART DOCUMENT

Patent Document

Patent Document 1: JP-A-2002-134394

SUMMARY OF THE INVENTION

Problems to be Solved by the Invention

However, according to Patent Document 1, since the first mask and the second mask are exchanged in each time of exposure, there is a problem that a tact time becomes long in accordance with the time required for mask exchange and the production efficiency is lowered, which leaves room for improvement.

The disclosure has been made in view of the above-described problems, and an object thereof is to provide a proximity exposure method capable of exposing and transferring mask patterns of a mask onto a workpiece at a pitch of resist patterns equal to or smaller than a resolution limit of a resist.

Means for Solving the Problems

The above object of the disclosure is achieved by the following configuration.

(1) A proximity exposure method of arranging a mask and a workpiece opposing each other with a predetermined gap therebetween and irradiating the workpiece with light for pattern exposure through the mask to expose and transfer mask patterns of the mask to a resist on the workpiece, the proximity exposure method including:
a mask preparation step of preparing the mask of which the mask patterns are formed at a pitch larger than a resolution limit of the resist with respect to resist patterns having a minimum pitch equal to or smaller than the resolution limit of the resist;
a first exposure step of exposing and transferring the mask patterns onto the workpiece;
a movement step of relatively step-moving the mask and the workpiece by the minimum pitch of the resist patterns; and
a second exposure step of exposing and transferring the mask patterns onto the workpiece again after the movement step.

(2) The proximity exposure method according to (1), wherein:
the resist patterns have a uniform pitch equal to or smaller than the resolution limit of the resist; and
the mask patterns are formed at the pitch of an integer multiple of twice or more the pitch of the resist patterns.

(3) The proximity exposure method according to (1) or (2), wherein:
a size of the mask patterns is larger than the minimum pitch of the resist patterns.

(4) The proximity exposure method according to any one of (1) to (3), wherein in:
the mask includes first and second mask-side marks arranged in a relative moving direction of the mask and the workpiece in the movement process;
the workpiece includes first and second workpiece-side marks arranged in the relative moving direction of the mask and the workpiece in the movement process;
one of the first and second mask-side marks and one of the first and second workpiece-side marks are formed in a manner spaced from each other by a predetermined distance in the relative moving direction;
the other one of the first and second mask-side marks and the other one of the first and second workpiece-side marks are formed in a manner spaced from each other by a sum of the minimum pitch of the resist patterns and the predetermined distance in the relative movement direction;
in the first exposure step, alignment of the workpiece and the mask is adjusted by the first mask-side mark and the first workpiece-side mark to perform exposure; and
the second exposure step, alignment of the workpiece and the mask is adjusted by the second mask-side mark and the second workpiece-side mark to perform exposure.

Effect of the Invention

According to the proximity exposure method of the disclosure, the mask of which the master patterns are formed at a pitch larger than a resolution limit of the resist is prepared with respect to the resist patterns having a minimum pitch equal to or smaller than the resolution limit of the resist; in the first exposure step, the mask and the workpiece are relatively step-moved by the minimum pitch of the resist patterns after the mask patterns are exposed and transferred onto the workpiece; and in the second exposure step, the mask patterns are exposed and transferred onto the workpiece again. Accordingly, the mask patterns can be exposed and transferred onto the workpiece at the minimum pitch of the resist patterns equal to or smaller than the resolution limit of the resist. In addition, replacement operation of the mask M is not necessary, the tact time is shortened, and the workpiece can be efficiently formed.

DESCRIPTION OF EMBODIMENTS

An exposure method according to an embodiment of the disclosure will be described in detail below with reference to the drawings.

Figure 1:
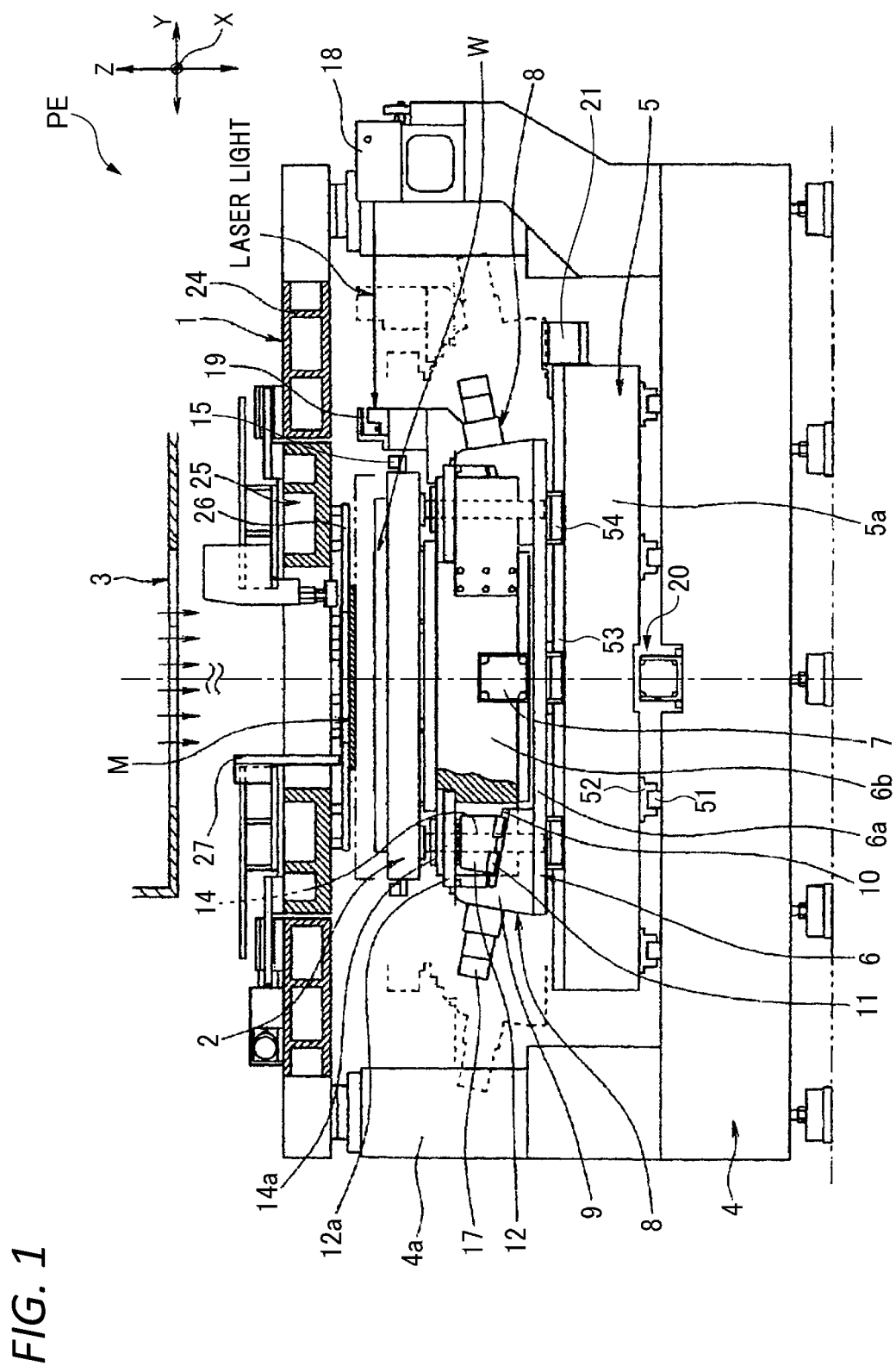
FIG. 1 is a front view of an exposure apparatus to which an exposure method according to the disclosure is applied.

As shown in FIG. 1, a proximity exposure apparatus PE to which an exposure method of the present embodiment is applied uses a mask M smaller than a workpiece W as a material to be exposed, holds the mask M with a mask stage 1, holds the workpiece W with a workpiece stage 2, and exposes and transfers patterns of the mask M onto a photoresist R on the workpiece W by irradiating the mask M with light for pattern exposure from an illumination apparatus 3 in a state where the mask M and the workpiece W are arranged opposing each other with a predetermined gap therebetween. Further, the workpiece stage 2 is step-moved in two axial directions including an X-axis direction and a Y-axis direction with respect to the mask M, so as to perform exposure and transfer in each step.

In order to step-move the workpiece stage 2 in the X-axis direction, an X-axis stage slide mechanism 5 for step-moving an X-axis slide 5a in the X-axis direction is disposed on an apparatus base 4. On the X-axis slide 5a of the X-axis stage slide mechanism 5, in order to step-move the workpiece stage 2 in the Y-axis direction, a Y-axis stage slide mechanism 6 for step-moving a Y-axis slide 6a in the Y-axis direction is installed. The workpiece stage 2 is installed on the Y-axis slide 6a of the Y-axis stage slide mechanism 6. The workpiece W is held on an upper surface of the workpiece stage 2 in a state vacuum-sucked by a workpiece chuck or the like. A substrate-side displacement sensor 15 for measuring a lower surface height of the mask M is disposed on a side portion of the workpiece stage 2. Therefore, the substrate-side displacement sensor 15 can move in the X and Y directions together with the workpiece stage 2.

On the apparatus base 4, a plurality of (four in the embodiment shown in the drawing) guide rails 51 for X-axis linear guide are arranged in the X-axis direction, and sliders 52 fixed to a lower surface of the X-axis slide 5a respectively straddle the guide rails 51. Thus, the X-axis slide 5a is driven by a first linear motor 20 of the X-axis stage slide mechanism 5, and is reciprocally movable in the X-axis direction along the guide rails 51. Moreover, on the X-axis slide 5a, a plurality of guide rails 53 for Y-axis linear guide are arranged in the Y-axis direction, and sliders 54 fixed to a lower surface of the Y-axis slide 6a respectively straddle the guide rails 53. Thus, the Y-axis slide 6a is driven by a second linear motor 21 of the Y-axis stage slide mechanism 6, and is reciprocally movable in the Y-axis direction along the guide rails 53.

In order to move the workpiece stage 2 in a vertical direction between the Y-axis stage slide mechanism 6 and the workpiece stage 2, a vertical coarse movement apparatus 7, which has a relatively coarse positioning resolution but large movement stroke and movement speed, and a vertical fine movement apparatus 8, which is capable of positioning at a high resolution as compared to the vertical coarse movement apparatus 7 and finely adjusts the gap between opposing surfaces of the mask M and the workpiece W by finely moving the workpiece stage 2 vertically, are disposed.

The vertical coarse movement apparatus 7 moves the workpiece stage 2 vertically with respect to a fine movement stage 6b described later with an appropriate drive mechanism provided on the fine movement stage 6b. A stage coarse movement shaft 14 fixed to four positions on the bottom surface of the workpiece stage 2 is engaged with a linear bearing 14a fixed to the fine movement stage 6b, and is guided in the vertical direction with respect to the fine movement stage 6b. It is desirable that the vertical coarse movement apparatus 7 has high repetition positioning accuracy even when the resolution is low.

The vertical fine movement apparatus 8 includes a fixing base 9 fixed to the Y-axis slide 6a, and a guide rail 10 for linear guide attached in a state in which an inner end side thereof is inclined obliquely downward; and a nut (not shown) of a ball screw is connected to a slide body 12 reciprocating along the guide rail 10 via a slider 11 straddling the guide rail 10, and an upper end surface of the slide body 12 is slidably in contact with a flange 12a fixed to the fine movement stage 6b in a horizontal direction.

When a screw shaft of the ball screw is rotationally driven by a motor 17 attached to the fixing base 9, the nut, the slider 11, and the slide body 12 integrally move in an oblique direction along the guide rail 10, whereby the flange 12a finely moves vertically.

The vertical fine movement apparatus 8 may drive the slide body 12 with a linear motor instead of driving the slide body 12 with the motor 17 and the ball screw.

Three vertical fine movement apparatuses 8 in total are disposed and respectively driven and controlled independently, including one on a one-end side (a left end side in FIG. 1) and two on an other-end side of a Z-axis slide 6a in the Y-axis direction. Thus, the vertical fine movement apparatus 8 finely adjusts a height and an inclination of the workpiece stage 2 by finely adjusting heights of the flange 12a at three positions based on a measurement result of a gap amount between the mask M and the workpiece W at a plurality of positions obtained by a gap sensor 27.

In a case where the height of the workpiece stage 2 can be sufficiently adjusted by the vertical fine movement apparatus 8, the vertical coarse movement apparatus 7 may be omitted.

A bar mirror 19 opposing a Y-axis laser interferometer 18 for detecting the position of the workpiece stage 2 in the Y direction and a bar mirror opposing an X-axis laser interferometer (both not shown) for detecting the position of the workpiece stage 2 in the X-axis direction are provided on the Y-axis slide 6a. The bar mirror 19 opposing the Y-axis laser interferometer 18 is arranged along the X-axis direction on one side of the Y-axis slide 6a, and the bar mirror opposing the X-axis laser interferometer is arranged along the Y-axis direction on a one-end side of the Y-axis slide 6a.

The Y-axis laser interferometer 18 and the X-axis laser interferometer are disposed constantly opposing the corresponding bar mirrors, respectively, and are supported by the apparatus base 4. Two Y-axis laser interferometers 18 are disposed in a manner spaced from each other in the X-axis direction. The two Y-axis laser interferometers 18 detect a position and a yaw error in the Y-axis direction of the Y-axis slide 6a and thus the workpiece stage 2 through the bar mirror 19. Further, the X-axis laser interferometer detects the position of the X-axis slide 5a and thus the workpiece stage 2 in the X-axis direction through the opposing bar mirror.

The mask stage 1 includes a mask base frame 24 formed of a substantially rectangular frame body and a mask frame 25 inserted through a gap into a central opening of the mask base frame 24 so as to be movable in X, Y, θ directions (an X, Y plane), and the mask base frame 24 is held at a fixed position above the workpiece stage 2 by a column 4a protruding from the apparatus base 4.

A frame-shaped mask holder 26 is provided on a lower surface of the central opening of the mask frame 25. That is, a plurality of mask holder suction grooves connected to a vacuum suction apparatus (not shown) are provided on the lower surface of the mask frame 25, and the mask holder 26 is sucked and held by the mask frame 25 via the plurality of mask holder suction grooves.

A plurality of mask suction grooves (not shown) for sucking a peripheral portion of the mask M on which the mask patterns are not drawn are opened on the lower surface of the mask holder 26, and the mask M is attachably and detachably held on the lower surface of the mask holder 26 by a vacuum suction apparatus (not shown) via the mask suction grooves.

The following describes in detail a case where the above-described proximity exposure apparatus PE is used to expose resist patterns having a minimum pitch equal to or smaller than a resolution limit of the resist R on the workpiece W (for example, a uniform pitch of 18 μm in the present embodiment), and having a size of 4 μm. Hereinafter, the resist of the workpiece W will be described as a positive resist, but may also be a negative resist.

In the present specification, the term "resist pattern" refers to a result after exposure and development, and refers to a part in which the resist is removed after development in a case of a positive resist, and a part in which the resist remains after development in a case of a negative resist.

The "resolution limit of the resist R" indicates a minimum pattern width of the resist patterns that can be realized.

Figure 6:
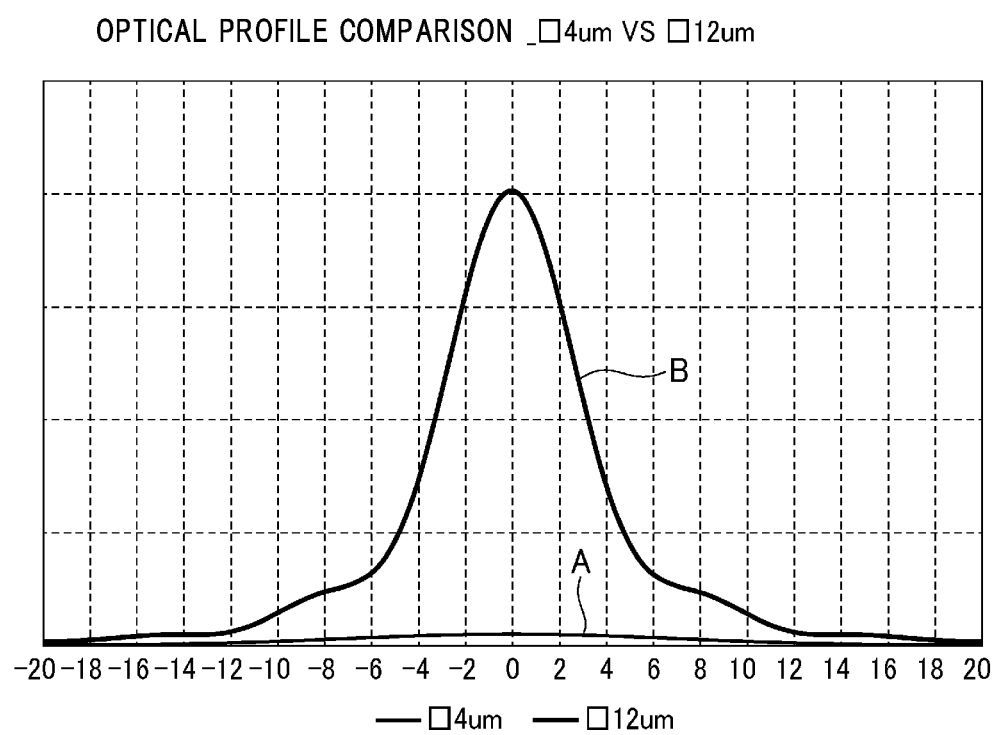
FIG. 6 is a graph showing a relationship between a size and an exposure intensity of the mask patterns.

For example, as shown in FIG. 6, in a case where exposure is performed using small mask patterns (openings) of □4 μm (having a length of one side of 4 μm), an exposure intensity required for exposure of the resist R cannot be obtained as shown by a curve A. On the other hand, when exposure is performed using mask patterns of □12 μm (having a length of one side of 12 μm), an exposure intensity exceeding an exposure threshold is obtained in a range of 4 μm in width as shown by a curve B. In other words, in order to obtain resist patterns of 4 μm, it is necessary to increase the size of the mask patterns to 12 μm.

This is because that in proximity exposure, since light incident on the mask patterns is not entirely irradiated on the exposed area of the resist R due to the diffusion of the exposure light, the size of the mask patterns must be increased accordingly. Therefore, in order to expose resist patterns having a size of 4 μm, the pitch of the mask patterns needs to be 12 μm or more.

Figure 7:
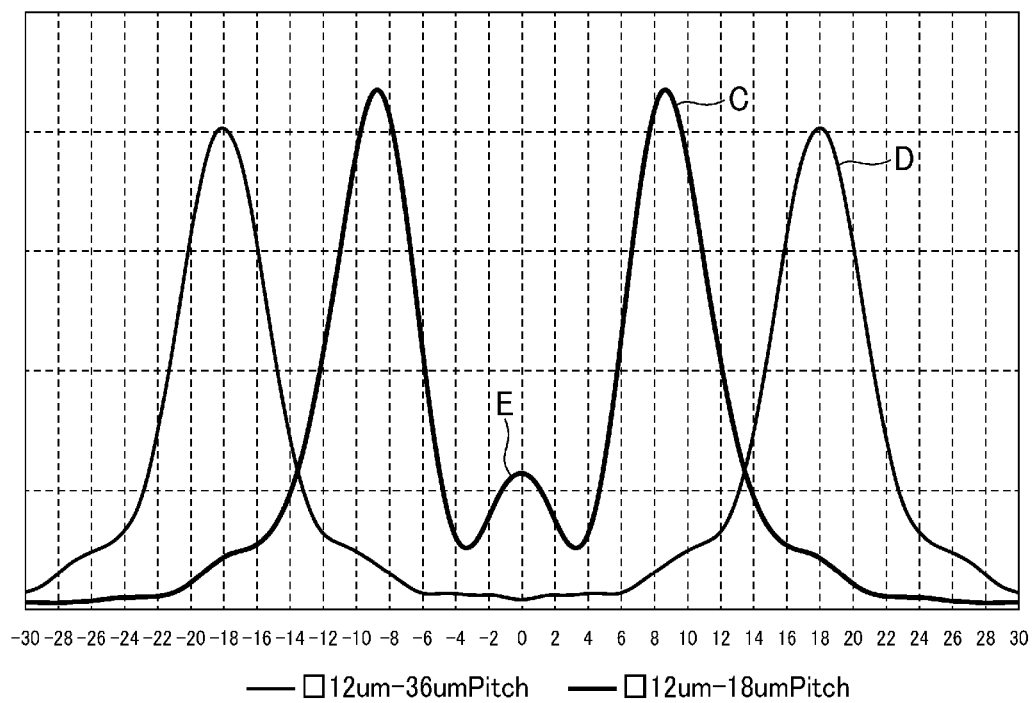
FIG. 7 is a graph showing a relationship between a pitch and the exposure intensity of the mask patterns.

Further, a case is considered in which the exposure is performed using a mask M having a size of mask patterns of 12 μm and a pitch of mask patterns of 18 μm as shown in a curve C in FIG. 7. In this case, although the pitch of the resist patterns (18 μm) becomes equal to or smaller than the resolution limit of the resist R, a region E having a strong exposure intensity is generated in a part shielded between adjacent mask patterns due to diffusion, diffraction, or the like of light incident from the mask patterns (opening), resulting in a profile failure of the resist patterns. That is, in the case of positive resist, the portion where the resist is removed due to development becomes large, and in the case of negative resist, the size of the resist remaining after development increases.

On the other hand, as shown by a curve D in FIG. 7, if the mask patterns of the mask M have a pitch 2P (36 μm) twice the resist pattern pitch P (18 μm), the resolution limit of the resist R increases, the exposure intensity between the mask patterns 31 is maintained low without being affected by diffusion or diffraction of the incident light from the mask patterns 31, and no profile failure occurs in the resist patterns.

Figure 2A:
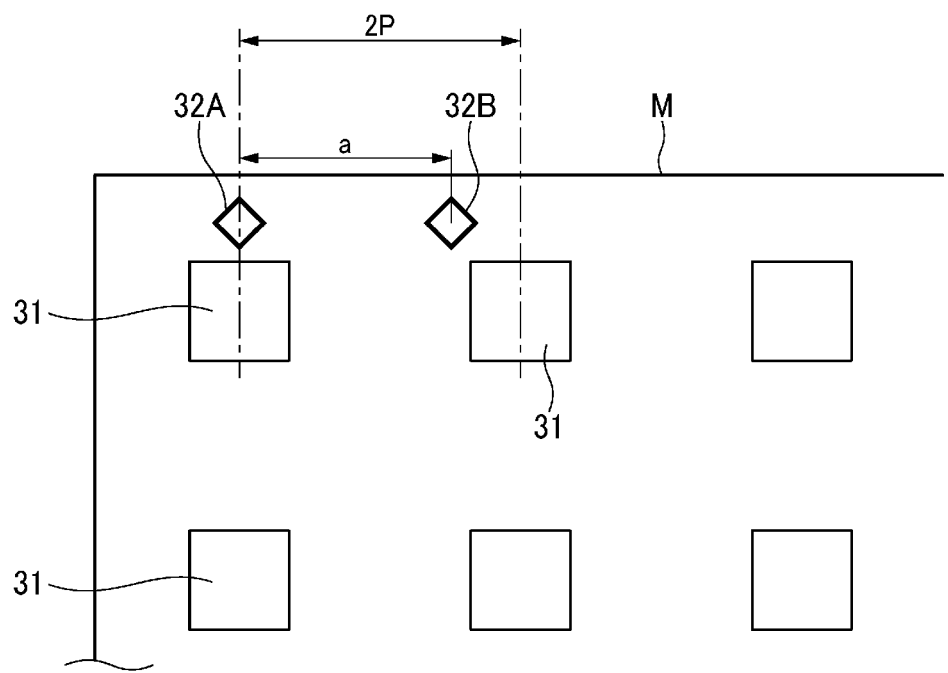
FIGS. 2A and 2B are plan views of a mask and a workpiece used in the exposure method according to the disclosure.
Figure 2B:
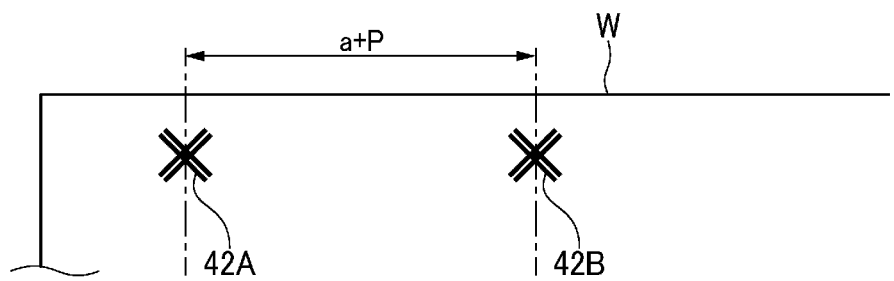
Figure 3:
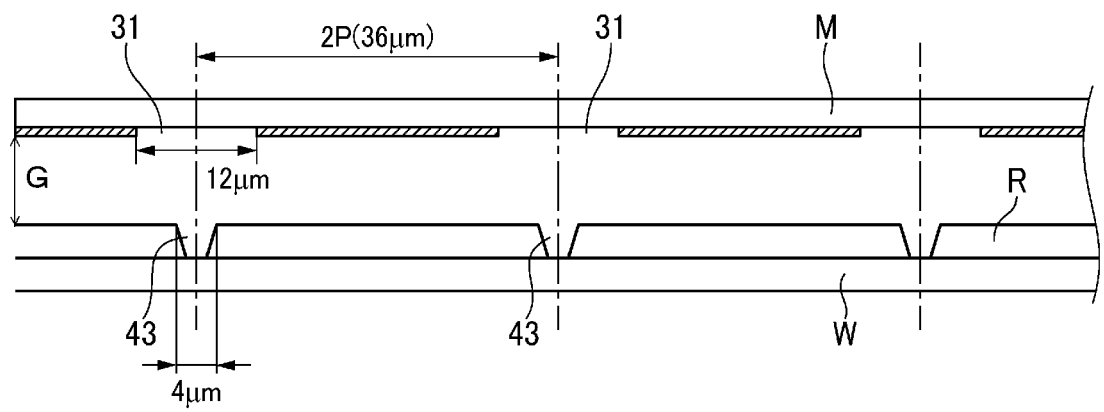
FIG. 3 is a cross-sectional view of the workpiece exposed by the mask shown in FIG. 2.

Therefore, in the exposure method of the present embodiment, as shown in FIGS. 2A, 2B and 3, the mask patterns 31 of □12 μm are exposed twice with step movement therebetween by using the mask M formed at the pitch 2P (36 μm) twice the pitch P (18 μm) of the resist patterns 43, thereby solving the problem of the resolution limit.

As shown in FIGS. 2A and 2B, the mask M and the workpiece W respectively include a pair of mask-side marks 32 and a pair of workpiece-side marks 42 for alignment adjustment. The mask-side mark 32 includes a first mask-side mark 32A, and a second mask-side mark 32B formed in a manner spaced from the first mask-side mark 32A in a relative movement direction of the mask M and the workpiece W by a predetermined distance a.

The workpiece-side mark 42 includes a first workpiece-side mark 42A, and a second workpiece-side mark 42B formed in a manner spaced from the first workpiece-side mark 42A in the relative movement direction of the mask M and the workpiece W by a distance of a sum of the predetermined distance a and the pitch P (18 μm) of the resist patterns. That is, the distance (a+P) between the pair of workpiece-side marks 42 (42A, 42B) is longer than the distance (a) between the pair of mask-side marks 32 (32A, 32B) by the pitch P of the resist patterns.

Next, a procedure for forming the resist patterns 43 having the pitch P (18 μm) smaller than the resolution limit of the resist R on the workpiece W by the mask M on which the mask patterns 31 are formed at the pitch 2P (36 μm) will be specifically described with reference to FIGS. 4A and 4B.

Figure 4A:
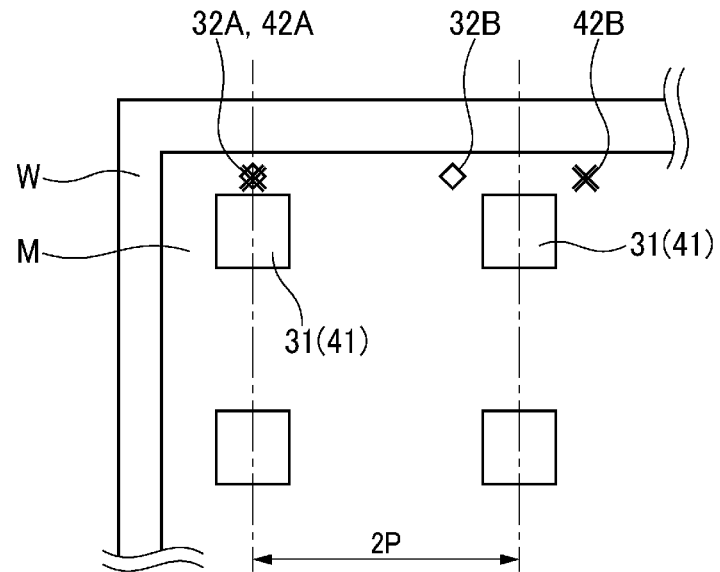
FIGS. 4A and 4B are conceptual diagrams showing an exposure procedure according to the disclosure.

As shown in FIG. 4A, the mask M, on which mask patterns 31 of which each side is 12 μm are formed at the pitch 2P (36 μm) twice the desired pitch P (18 μm), is prepared and held on the lower surface of the mask holder 26 by the vacuum suction apparatus (mask preparation step).

Next, the mask M and the workpiece W are arranged opposing each other at a predetermined gap G, the mask M or the workpiece W is moved, so as to adjust the alignment between the mask M and the workpiece W by aligning the first mask-side mark 32A and the first workpiece-side mark 42A using an alignment camera (not shown). Then, the light for pattern exposure is irradiated onto the workpiece W from the illumination apparatus 3 through the mask M, so as to expose and transfer the mask patterns 31 of the mask M onto the workpiece W (first exposure step).

At this time, since the pitch 2P of the mask patterns 31 is 36 μm, which is larger than the resolution limit of the resist R, as shown by the curve D in FIG. 7, exposed areas 41 of □12 μm without profile failure are formed on the workpiece W without being affected by diffusion or diffraction of the incident light from the mask patterns 31.

Figure 4B:
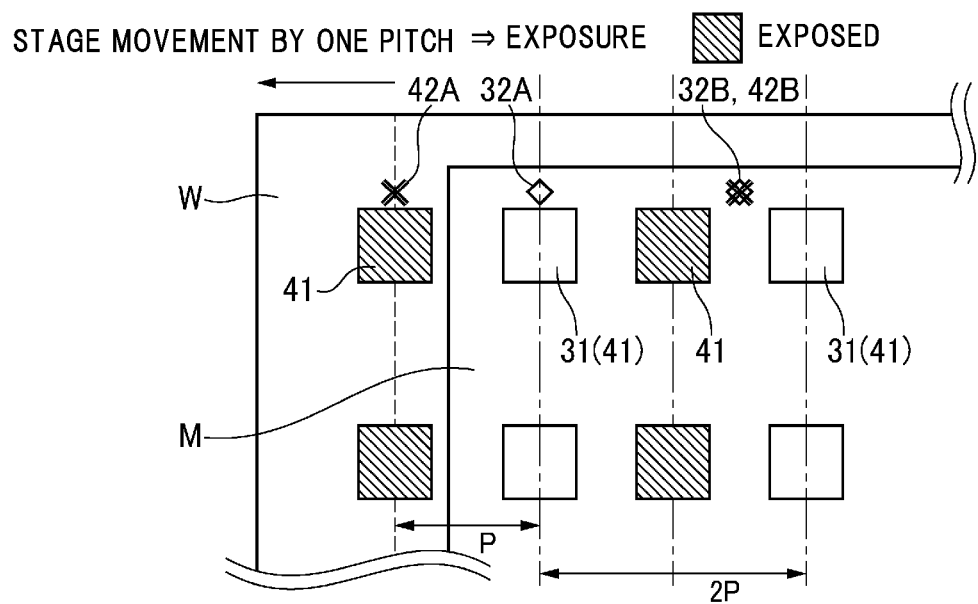

Next, when the workpiece W is relatively moved to the left by one pitch (18 μm) with respect to the mask M (movement step), as shown in FIG. 4B, the mask patterns 31 of the mask M are positioned at centers between the previously exposed areas 41 of the workpiece W as shown in FIG. 4B. At the same time, the second mask-side mark 32B and the second workpiece-side mark 42B are arranged in the same field of view of the alignment camera. Here, the mask M or the workpiece W is moved, so as to adjust the alignment between the mask M and the workpiece W again by aligning the second mask-side mark 32B and the second workpiece-side mark 42B. Then, the light for pattern exposure is irradiated onto the workpiece W from the illumination apparatus 3 through the mask M, so as to expose and transfer the mask patterns 31 of the mask M onto the workpiece W (second exposure step).

As a result, a plurality of exposed areas 41 arranged at the pitch P (18 μm) equal to or smaller than the resolution limit of the resist R are formed on the workpiece W. Further, by developing the workpiece W onto which the mask patterns 31 are exposed, the workpiece W on which the resist patterns 43 of 4 μm are arranged at a pitch of 18 μm is obtained. That is, the workpiece W on which the resist patterns 43 are formed can be manufactured at a pitch P (18 μm) equal to or smaller than the resolution limit of the resist R.

Although the conventional exposure method requires replacement of the mask M in each time of exposure (first and second exposure steps), the exposure method of the present embodiment is capable of forming the resist patterns 43 having the pitch P equal to or smaller than the resolution limit of the resist R only by performing step exposure without replacing the mask M, thereby significantly improving the production efficiency.

Figure 5A:
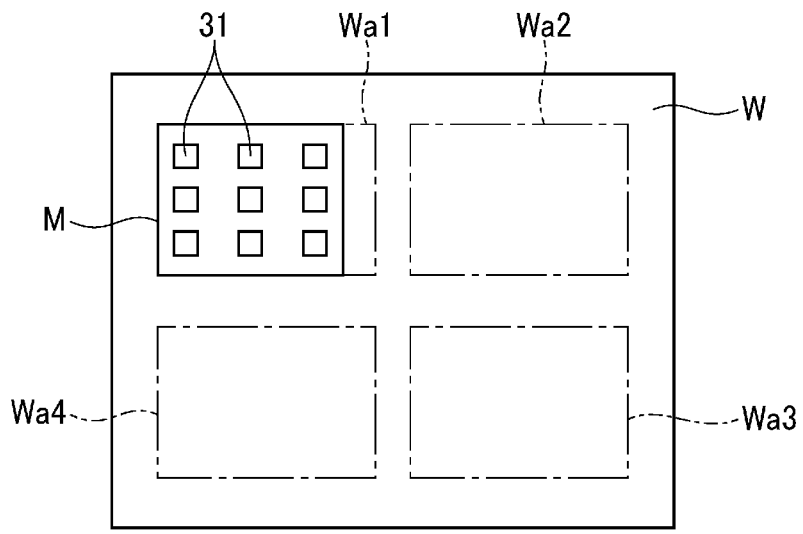
FIGS. 5A to 5C are conceptual diagrams showing a procedure of exposing mask patterns onto a workpiece having four exposure areas.
Figure 5B:
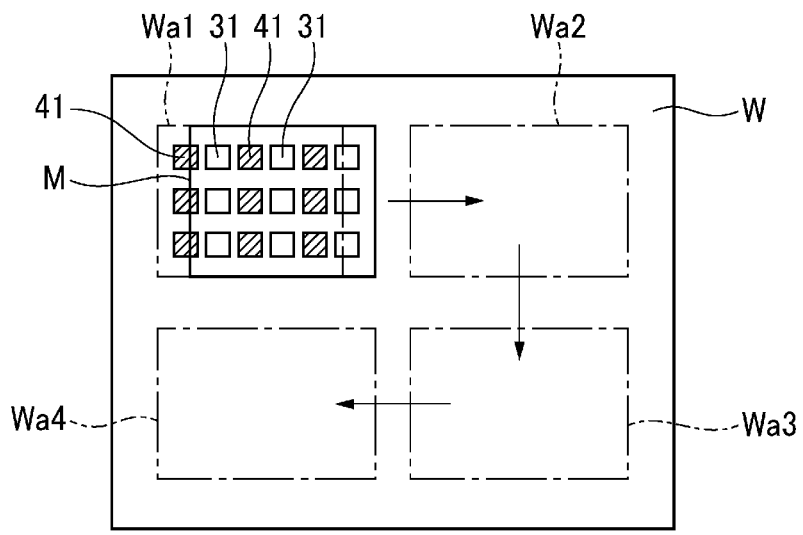
Figure 5C:
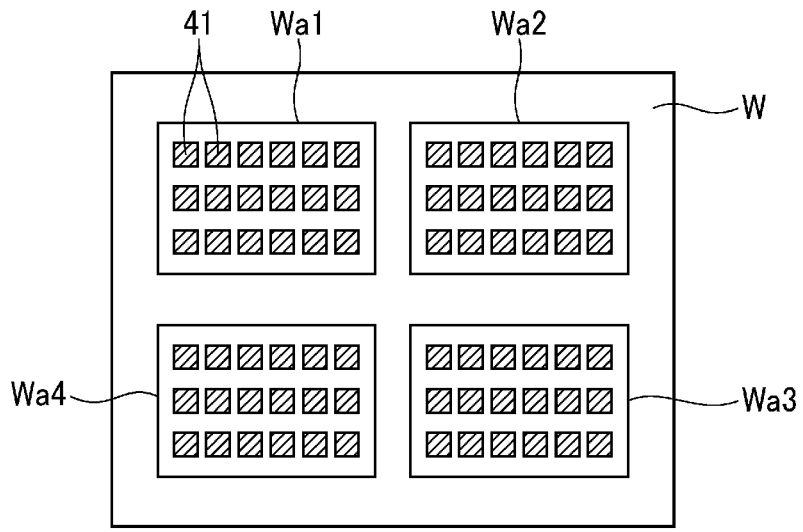

FIGS. 5A to 5C is a conceptual diagram illustrating a procedure of sequentially exposing and transferring the mask patterns 31 to the workpiece W having four product areas Wa1 to Wa4 to create a workpiece W having a large size. Sizes of the product areas Wa1 to Wa4 are set to be longer than the size of the mask M (strictly, the size of the mask patterns) by at least one pitch (18 μm) in the relative movement direction of the workpiece W and the mask M.

first, as shown in FIG. 5A, the mask M having the pitch of the mask patterns 31 of two pitches (36 μm) is arranged in the first product area Wa1, and as illustrated in FIGS. 4A and 4B, after adjusting alignment with the first mask-side mark 32A and the first workpiece-side mark 42A, the mask patterns 31 of the mask M are exposed and transferred onto the first product area Wa1.

Next, as shown in FIG. 5B, the workpiece W is moved to the left by one pitch (18 μm) relative to the mask M, the alignment is adjusted with the second mask-side mark 32B and the second workpiece-side mark 42B, and the mask patterns 31 of the mask M are exposed and transferred again onto the first product area Wa1.

In the first product area Wa1, the exposed areas 41 (resist patterns 43) are formed at the pitch P (18 μm) equal to or smaller than the resolution limit of the resist R by performing exposure twice with the mask patterns 31 of the mask M displaced by one pitch (18 μm).

Next, the workpiece W is greatly moved to the left so that the mask M is arranged in the second product area Wa2, and the exposed areas 41 (resist patterns 43) are formed in the second product area Wa2 at the pitch P (18 μm) equal to or smaller than the resolution limit of the resist R, similarly to the exposure in the first product area Wa1.

Then, as shown in FIG. 5C, exposure is also performed twice in the third and fourth product areas Wa3 and Wa4, and the exposed areas 41 (resist patterns 43) are formed at the pitch P (18 μm) equal to or smaller than the resolution limit of the resist R, respectively.

By performing exposure for eight times on the workpiece W having the four product areas Wa1 to Wa4 in this manner, the resist patterns 43 can be formed at the pitch P equal to or smaller than the resolution limit of the resist R more efficiently than the conventional method.

As described above, according to the proximity exposure method of the present embodiment, the mask M of which the master patterns 31 are formed at the pitch 2P larger than the resolution limit of the resist R is prepared with respect to the resist patterns 43 having the minimum pitch P equal to or smaller than the resolution limit of the resist R; in the first exposure step, the mask M and the workpiece W are relatively step-moved by the minimum pitch P of the resist patterns 43 after the mask patterns 31 are exposed and transferred onto the workpiece W; and in the second exposure step, the mask patterns 31 are exposed and transferred onto the workpiece W again. Accordingly, the mask patterns 31 can be exposed and transferred at the minimum pitch P of the resist patterns 43 equal to or smaller than the resolution limit of the resist R. Even in a case where the size of the mask patterns 31 is larger than the desired pitch P of the resist patterns 43 and the mask M itself cannot be manufactured directly at the pitch P, exposure and transfer to the workpiece W can be performed at the desired pitch P by using the mask M of the present embodiment. In addition, replacement operation of the mask M required in the conventional exposure method is not necessary, the tact time is shortened, and the workpiece can be efficiently formed.

Since the resist patterns 43 have the uniform pitch equal to or smaller than the resolution limit of the resist R and the mask patterns 31 are formed at the pitch 2P which is an integer multiple of twice or more the pitch P of the resist patterns 43, the mask patterns 31 can be exposed and transferred onto the workpiece W at the desired uniform pitch P.

The mask M includes the first and second mask-side marks 32A and 32B arranged in the step movement direction, the workpiece W includes first and second workpiece-side marks 42A and 42B arranged in the step movement direction, the first and second mask-side marks 32A and 32B are spaced from each other by the predetermined distance a in the relative movement direction, and the first and second workpiece-side marks 42A and 42B are spaced from each other by the sum of the pitch P of the resist patterns 43 and the predetermined distance a in the relative movement direction. Further, since the alignment of the workpiece W and the mask M is adjusted with the first mask-side mark 32A and the first workpiece-side mark 42A to perform exposure in the first exposure step, and the alignment of the workpiece W and the mask M is adjusted with the second mask-side mark 32B and the second workpiece-side mark 42B to perform exposure in the second exposure step, the mask patterns 31 can be exposed and transferred onto the workpiece W at a high pitch accuracy even when exposed for a plurality of times.

Although the mask M and the workpiece W are step-moved relative to each other by moving the workpiece W with respect to the mask M in the above embodiment, the mask M may be step-moved with respect to the workpiece W as well. In this case, the first and second workpiece-side marks 42A and 42B are spaced from each other by a predetermined distance a in the relative movement direction, and the first and second mask-side marks 32A and 32B are spaced from each other by the sum of the pitch P of the resist patterns 43 and the predetermined distance a in the relative movement direction.

The disclosure is not limited to the embodiments described above, and modifications, improvements, and the like can be made as appropriate.

For example, the proximity exposure method of the disclosure can be similarly applied to a mask M subjected to OPC (Optical Proximity Correction) treatment, of which the size of the mask patterns 31 tends to be larger than the desired pitch of the resist patterns 43. Also in this case, exposure is performed using a mask M having mask patterns of a pitch twice the pitch of the resist patterns 43. In addition, the mask M subjected to the OPC treatment is suitably used for exposure of a contact hole exposing a semiconductor substrate, which is used when forming the semiconductor substrate.

In addition, although only the resolution limit of the resist pattern in one direction (for example, the X direction) is considered in the above embodiment, step exposure may be performed for a plurality of times by step-moving in the Y direction in a similar manner.

Further, in the above embodiment, the pitch of the resist patterns 43 is made uniform, and the pitch of the mask patterns 31 is an integer multiple of twice the pitch P of the resist patterns 43, but the disclosure is not limited thereto. That is, the pitch of the resist pattern 43 may be not uniform as long as the step exposure of the disclosure is performed using a mask on which mask patterns are formed at a pitch larger than a resolution limit of a resist with respect to resist patterns having a minimum pitch equal to or smaller than the resolution limit of the resist.

The disclosure is based on Japanese Patent Application number 2016-194981 filed Sep. 30, 2016, the contents of which are incorporated herein by reference.

DESCRIPTION OF REFERENCE NUMERALS

31 Mask pattern
32A first mask-side mark
32B second mask-side mark
41 Exposed area
42A first workpiece-side mark
42B second workpiece-side mark
43 Resist pattern
a Predetermined distance
G Gap
M Mask
P Pitch of resist pattern
2P Pitch of mask pattern
W Workpiece

The invention claimed is:

1. A proximity exposure method of arranging a mask and a workpiece opposing each other with a predetermined gap therebetween and irradiating the workpiece with light for pattern exposure through the mask to expose and transfer mask patterns of the mask to a resist on the workpiece, the proximity exposure method comprising:
   a mask preparation step of preparing the mask of which the mask patterns are formed at a pitch larger than a resolution limit of the resist with respect to resist patterns having a minimum pitch equal to or smaller than the resolution limit of the resist;
   a first exposure step of exposing and transferring the mask patterns onto the workpiece;
   a movement step of relatively step-moving the mask and the workpiece by the minimum pitch of the resist patterns; and
   a second exposure step of exposing and transferring the mask patterns onto the workpiece again after the movement step, wherein:
   the mask includes first and second mask-side marks arranged in a relative moving direction of the mask and the workpiece in the movement process;
   the workpiece includes first and second workpiece-side marks arranged in the relative moving direction of the mask and the workpiece in the movement process;
   one of the first and second mask-side marks and one of the first and second workpiece-side marks are formed in a manner spaced from each other by a predetermined distance in the relative moving direction;
   the other one of the first and second mask-side marks and the other one of the first and second workpiece-side marks are formed in a manner spaced from each other by a sum of the minimum pitch of the resist patterns and the predetermined distance in the relative movement direction;
   in the first exposure step, alignment of the workpiece and the mask is adjusted by the first mask-side mark and the first workpiece-side mark to perform exposure; and
   in the second exposure step, alignment of the workpiece and the mask is adjusted by the second mask-side mark and the second workpiece-side mark to perform exposure.

2. The proximity exposure method according to claim 1, wherein:
   the resist patterns have a uniform pitch equal to or smaller than the resolution limit of the resist; and
   the mask patterns are formed at the pitch of an integer multiple of twice or more the pitch of the resist patterns.

3. The proximity exposure method according to claim 1, wherein:
   a size of the mask patterns is larger than the minimum pitch of the resist patterns.

* * * * *